(12) United States Patent
Kuppens

(10) Patent No.: US 7,701,369 B2
(45) Date of Patent: Apr. 20, 2010

(54) METHOD AND ENCODER FOR ENCODING A SIZE OF A DATA SECTION AND METHOD AND DECODER FOR DETERMINING A SIZE OF A DATA SECTION

(75) Inventor: Chris Kuppens, Oosterhout (NL)

(73) Assignee: Thomson Licensing, Issy les Moulineaux (FR)

( * ) Notice: Subject to any disclaimer, the term of this patent is extended or adjusted under 35 U.S.C. 154(b) by 106 days.

(21) Appl. No.: 12/215,318

(22) Filed: Jun. 26, 2008

(65) Prior Publication Data
US 2009/0002209 A1 Jan. 1, 2009

(30) Foreign Application Priority Data
Jun. 27, 2007 (EP) .................................. 07301156

(51) Int. Cl.
*H03M 7/00* (2006.01)
(52) U.S. Cl. .......................................................... 341/63
(58) Field of Classification Search .................... 341/63, 341/65, 67
See application file for complete search history.

(56) References Cited

U.S. PATENT DOCUMENTS

| | | | | |
|---|---|---|---|---|
| 3,675,211 A | * | 7/1972 | Raviv ............................ | 341/67 |
| 4,247,891 A | * | 1/1981 | Flynn et al. .................... | 341/63 |
| 5,841,379 A | * | 11/1998 | Seshan et al. .................. | 341/63 |
| 6,014,095 A | * | 1/2000 | Yokoyama ..................... | 341/67 |
| 2005/0134486 A1 | * | 6/2005 | Lovell .......................... | 341/60 |

OTHER PUBLICATIONS

Anonymous: "Decimal To Binary Conversion" Internet Article, May 10, 2001, XP002449916 Retrieved from the Internet: URL: http://www.is.wayne.edu/olmt/binary/pa_ge3.htm> [retrieved on Aug. 30, 2007] *the whole document*.
Anonymous: "Binary To Decimal Conversion" 4-7 Internet Article, [Online] May 10, 2001, XP002448815 Retrieved from the Internet: URL:http://www..is.wayne.edu/olmt/binary/paget2.htm> [retrieved on Aug. 30, 2007] *the whole document*.
"Fast Decimal-to-Binary Conversion Technique" IBM Technical Disclosure Bulletin IBM vol. 32, No. 2, Jul. 1, 1989, pp. 142-143, XP000033373 ISSN: 0018-8689 *the whole document*.
Anonymous: "Dancing with Strings" Internet Article, [Online] May 17, 2001, XP002448817 Retrieved from Internet: URL:http://www.geocities.com/SiliconValley_/Park/3230/pas/pas11007.html> [retrieved on Aug. 30, 2007] *the whole document*.
European Search Report EP 07 30 1156 Sep. 3, 2007.

* cited by examiner

*Primary Examiner*—Howard Williams
(74) *Attorney, Agent, or Firm*—Robert D. Shedd; Jeffrey M. Navon

(57) ABSTRACT

The invention is related to a method for encoding a size of a data section and to an encoder for encoding a size of a data section. The invention is further related to a method for determining a size of a data section and to a decoder for determining a size of a data section. The method for encoding a size of a data section comprises the step of increasing the size and the step of determining the number of information units necessary for encoding the increased size. Furthermore, the method comprises the step of decreasing the determined number and the step of forming a code by encoding the decreased determined number and by encoding the increased size. Due to knowledge of an increased lower bound, instead of the number of information units actually necessary for encoding the size a decreased number can be encoded.

9 Claims, 4 Drawing Sheets

Figure 4:
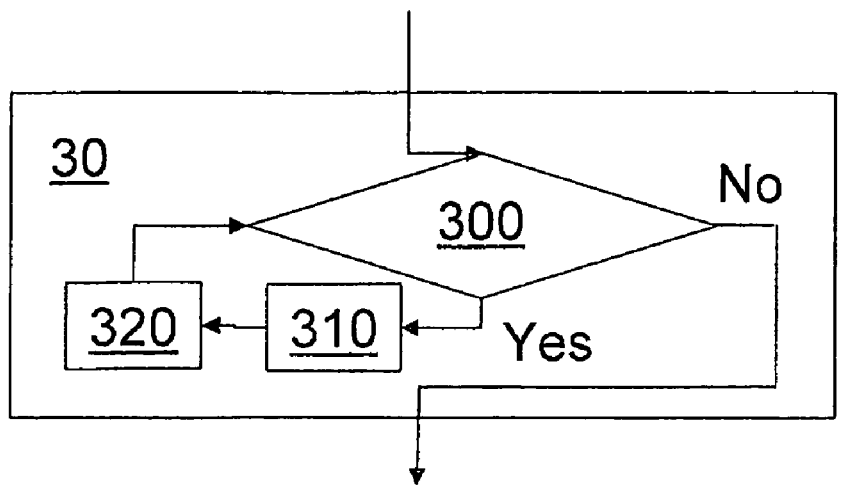

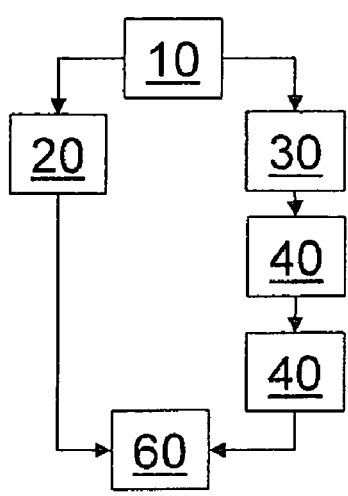
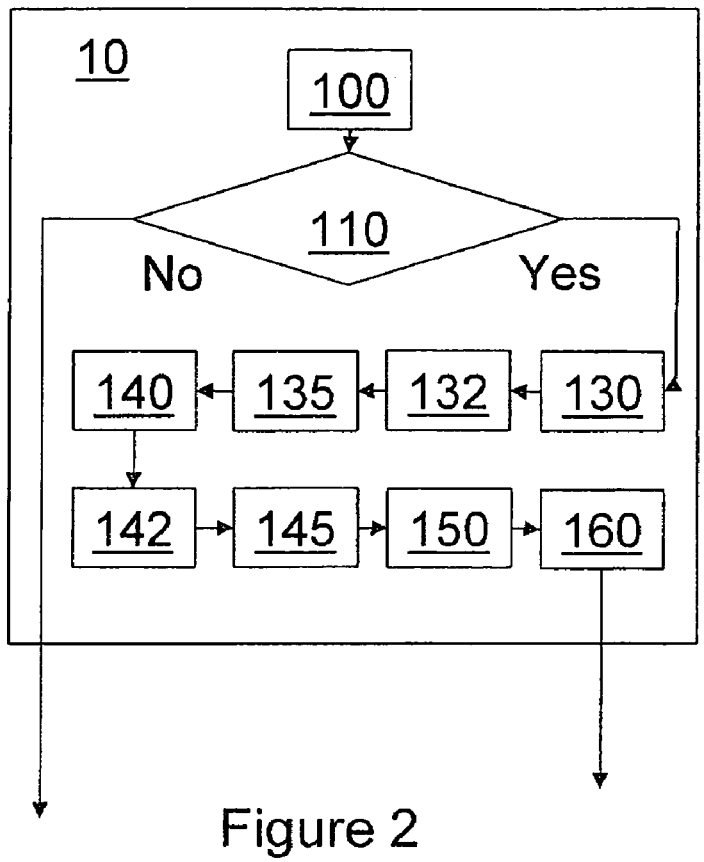
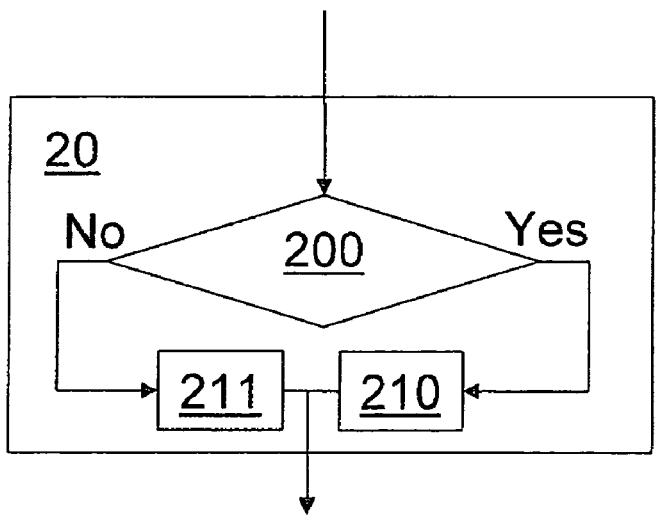
Figure 1
Figure 2
Figure 3

METHOD AND ENCODER FOR ENCODING A SIZE OF A DATA SECTION AND METHOD AND DECODER FOR DETERMINING A SIZE OF A DATA SECTION

This application claims the benefit, under 35 U.S.C. §119, of European Patent Application No. 07301156.1 filed Jun. 27, 2007.

BACKGROUND

The invention is related to a method for encoding a size of a data section and to an encoder for encoding a size of a data section. The invention is further related to a method for determining a size of a data section and to a decoder for determining a size of a data section.

An encoded size may indicate the length of a subsequent signal value section of variable length, the extent of a subsequent filename or an amount of subsequent information units used for encoding other data. That is, an encoded size may be used as a prefix in a variable length encoding scheme.

In variable length coding, varying numbers of information units are used for encoding pay load data. The information units used for some pay load data form a data section of variable extent. The extent of the data section corresponds to the length of the code representing the pay load data. To allow decoding of an encoded integer signal value, the extent of the data section is encoded as a size in a prefix. Thus, the size represents the number of information units used for coding the integer signal value.

The prefix itself may be formed from a variable number of information units and thus may have variable length. If so, this requires at least a preceding portion of the prefix being encoded independently. That is, the preceding portion can be decoded without further information.

To meet this requirement the preceding portion commonly comprises unary code, i.e. a number of information units of equal content. This number indicates the size of the remaining part of the prefix.

As the size of the remaining part is at least 1, the number of information units of equal content can be by one smaller than the size of the remaining part. So the size of the preceding portion is by 1 smaller than the size of the remaining part.

The remaining part of the prefix then comprises the binary encoded size.

Variable length coding allows for efficient use of storage space and transmission bandwidth. Therefore, it is used in a variety of technical applications. For instance, variable length coding is used for encoding visual sensor inputs, for transmission of video or multimedia streams or for storage of audio data, just to name a few.

The advantages of variable length coding come along with the overhead of requiring prefixes. Especially the preceding portion is bulky due to the requirement of independent encoding. Thus, there is a need for further reducing the average size of the preceding portion.

INVENTION

This is achieved by a method for encoding a size of a data section, the method comprising the features of claim 1.

That is, the method comprises the step of increasing the size and the step of determining the number of information units necessary for encoding the increased size. Furthermore, the method comprises the step of decreasing the determined number and the step of forming a code by encoding the decreased determined number and by encoding the increased size.

By increasing the size an increased lower bound for the number of information units necessary for encoding said increased size is defined. Due to knowledge of such increased lower bound, instead of the number of information units actually necessary for encoding the size a decreased number can be encoded. In average, this reduces the total number of information unites needed for encoding the size.

It is preferred, if the size is increased by 1 while the number of information units is decreased by 2. Then, the average number of additional information units needed for encoding the increased size is smaller than the average number of information units saved in encoding the decreased number of information units.

In an advantageous embodiment, the increased size indicator is binary encoded and the decreased determined number is encoded by a respective number of information units of equal content, wherein the code is formed by concatenating both encodings. This meliorates the ratio of the average number of additional information units and the average number of information units saved.

The invention is also related to a method for determining a size from a string of information units, the method comprising the features of claim 4.

The method for determining a size comprises the step of reading one or more information units until a information unit with a pre-defined value is read. The number of information units read is counted. The method further comprises the step of increasing the counted number by a given number. Additionally, the step of reading the increased counted number of subsequent information units and the step of decoding a value comprised in the subsequent information units read are comprised. Finally, the step of determining the size by decreasing the decoded value is comprised in the method for determining a size.

Furthermore, the invention is related to an encoder for encoding a size and a decoder for determining a size from a string of information units, wherein the decoder comprises the features of claim 7 and the encoder comprises the features of claim 8.

In a preferred embodiment of the encoder the increasing means are adapted to increase the size indicator value by one and the decreasing means are adapted to reduce the number of information units by two.

Furthermore, it is preferred that the encoding means are adapted to code the increased size indicator binary and to code the reduced number of information units unary. Additionally, the encoder comprises means for concatenating the binary code and the unary code.

The invention is also related to a signal and a storage medium comprising a size indicator wherein the size indicator is encoded with any of the inventive methods for encoding a size.

DRAWINGS

Exemplary embodiments of the invention are illustrated in the drawings and are explained in more detail in the following description.

Figure 5:
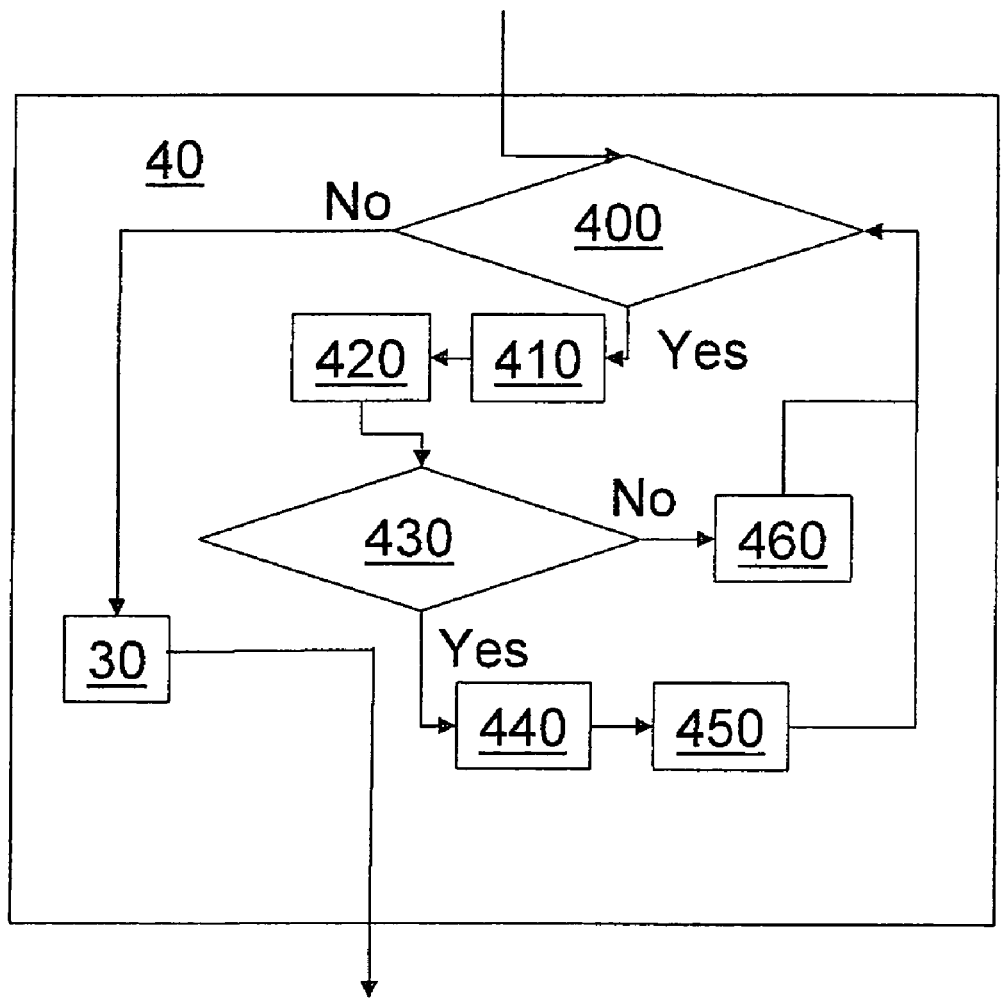
Figure 6:
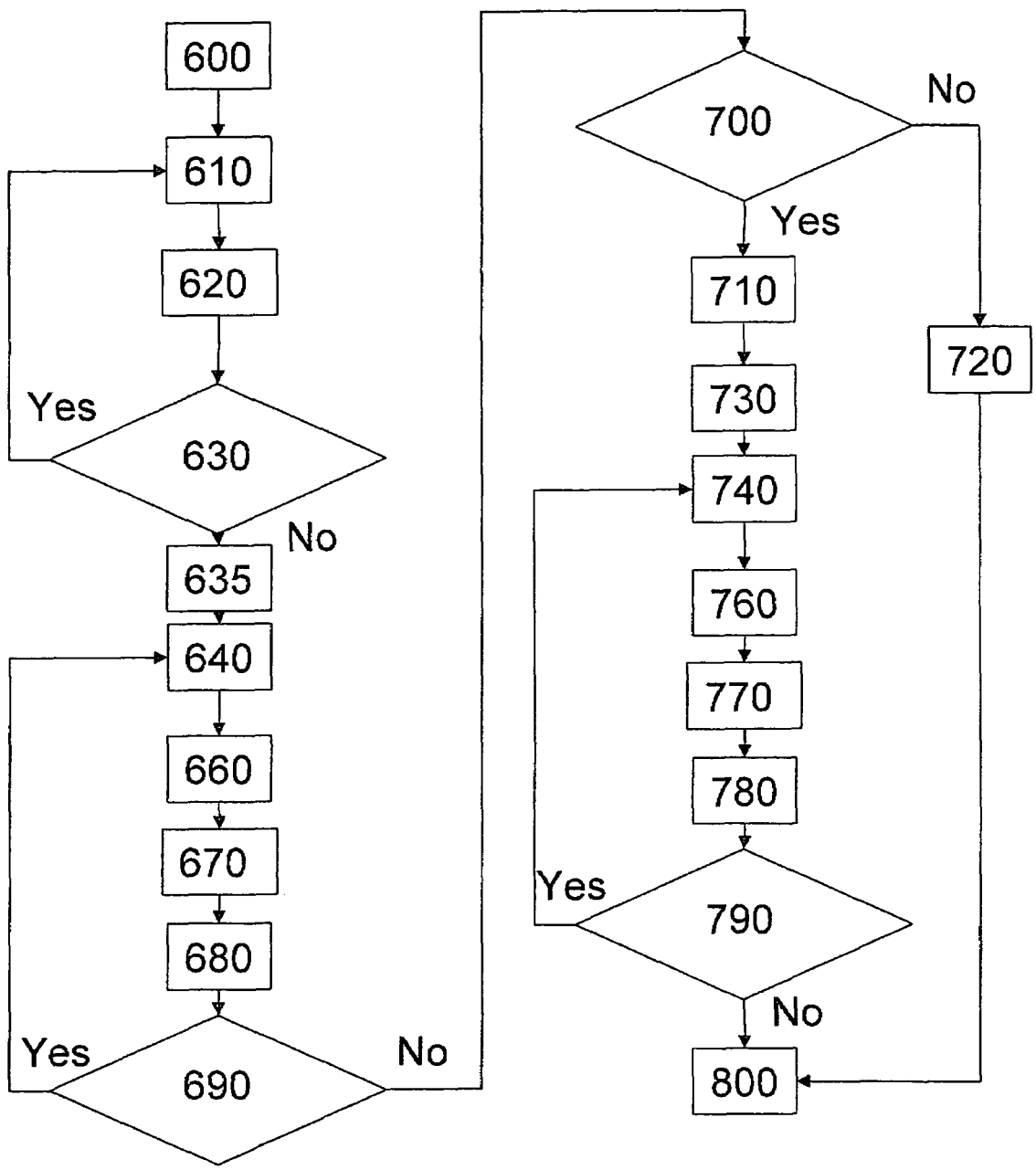
Figure 7:
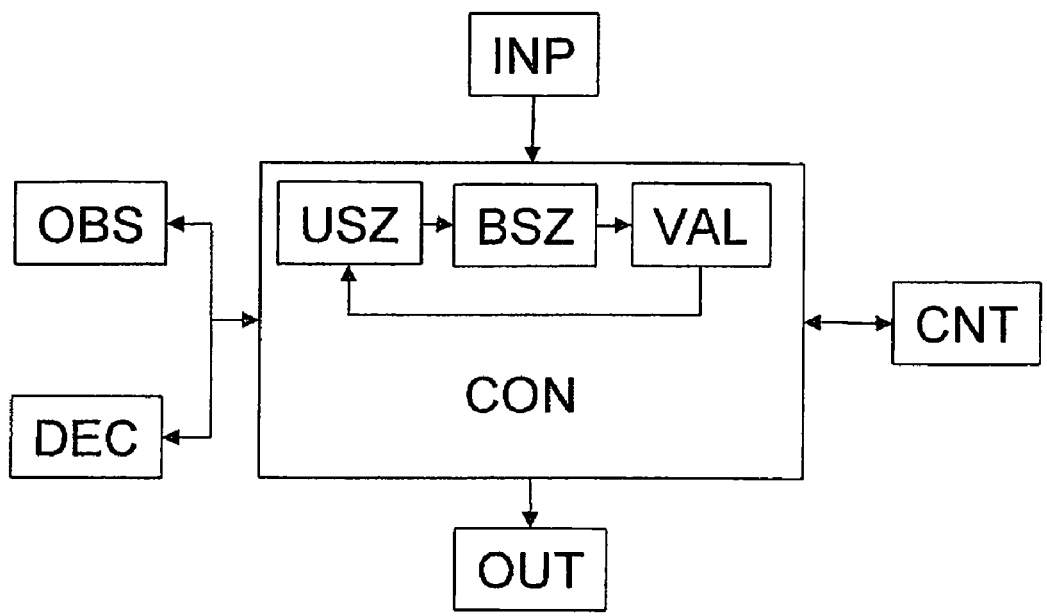
Figure 8:
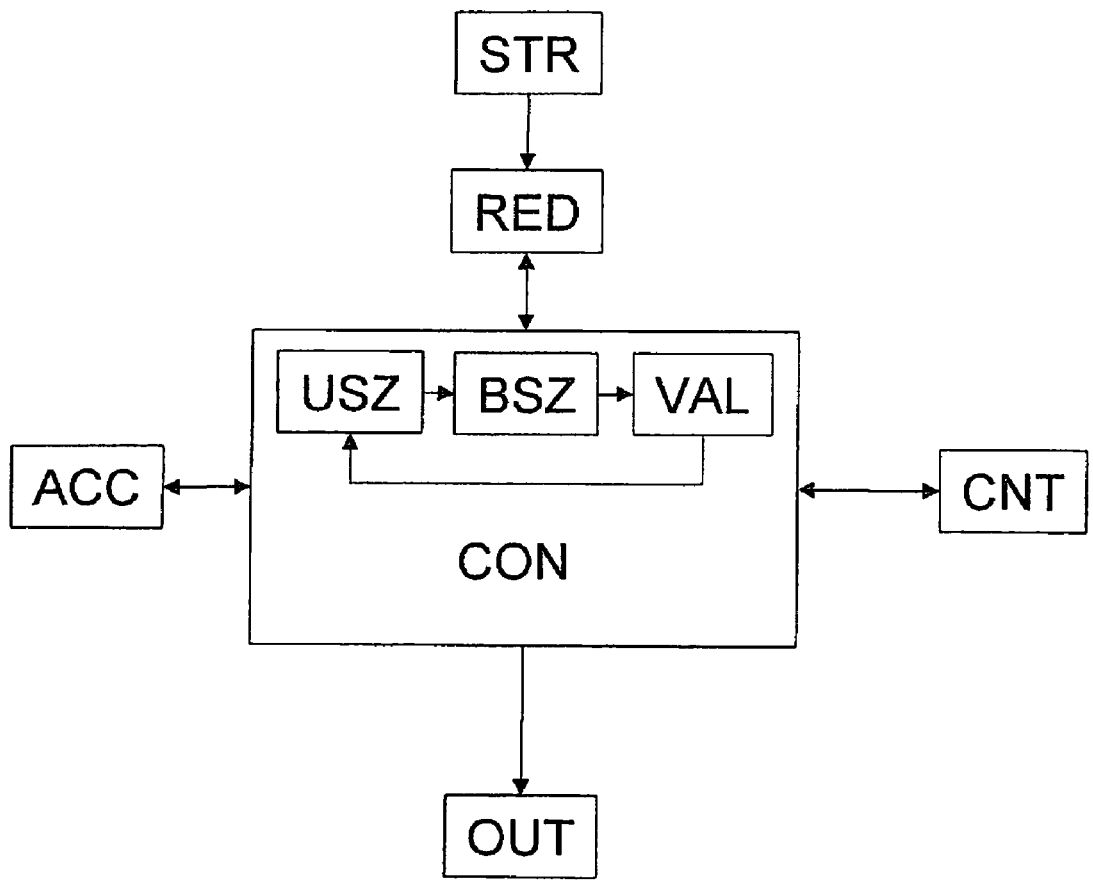

In the figures:

FIG. 1 shows an exemplary flow chart of variable length coding of a value using the inventive method for encoding size, FIG. 2 shows details of an exemplary initialization step being part of the exemplary embodiment of variable length coding depicted in FIG. 1, FIG. 3 shows details of an exemplary variable length encoding step for numbers smaller than 2 being part of the exemplary embodiment of variable length coding depicted in FIG. 1, FIG. 4 shows details of an exemplary step of forming an unary coded part of a prefix wherein said exemplary unary coding step is part of the exemplary embodiment of variable length coding depicted in FIG. 1, FIG. 5 shows details of an exemplary step of forming an binary coded part wherein said exemplary binary coding step is part of the exemplary embodiment of variable length coding depicted in FIG. 1, FIG. 6 shows an exemplary flow chart of decoding a variable length coded value said decoding using the inventive method for decoding size FIG. 7 shows an exemplary embodiment of the inventive encoder and FIG. 8 shows an exemplary embodiment of the inventive decoder.

EXEMPLARY EMBODIMENTS

FIG. 1 exemplarily shows how an exemplary embodiment of the inventive method for encoding a size could be used in an exemplary variable length coding of a integer signal value. The size is encoded in a prefix.

The method commences with step 10 of initialization. The details of step 10 will be explained by help of FIG. 2. Within step 10, a first size, a second size, a first counter, a second counter and a reduced integer signal value are initialized.

Step 10 comprises step 100, the reception of the integer signal value V to-be-encoded. Then in step 110, it is checked whether integer signal value V is greater than 1. If so, the method passes to step 130.

In step 130, a first size L is determined according the following equation:

$$L(V)=\text{int}(\log_2(V))+1 \quad (1)$$

The first size L is the number of bits required for binary encoding integer signal value V. A first counter variable C is initialized to L in step 132. In step 135, the first size L is increased by 1.

In step 140, integer signal value V is diminished by 2 raised to the power of (L−2).

A second size L' is determined by help of increased first size L in step 142 according to:

$$L'(L)=\text{int}(\log_2(L))+1 \quad (2)$$

The second size L' is the number of bits required for binary encoding first size L. A second counter variable C' is initialized to L' in step 145. In step 150, the second size L' is decreased by 2.

In step 160, an output bit string is initialized as an empty bit string of length 0, for example as a pointer.

If in step 100 it was determined that the integer signal value V is not greater than 1, the method passes to step 20.

Step 20 comprises the decision step 200, as depicted in FIG. 3. In decision step 200 it is determined whether integer signal value V equals 0. If so, an output bit string is determined in step 210 to be "100", otherwise it is determined in step 211 to be "101".

Step 30 transforms an input size into a bit string of Zero valued bits. The length of the bit string of Zero valued bits equals the input size.

As shown in FIG. 4, step 30 comprises a decision step 300 which checks whether the input size is greater than 0. If so, a bit of value 0 is appended to the to-be-outputted bit string in step 310. And, the input size is decreased by 1 in step 320. Then the method returns to step 300. If the input size is not greater than 0, the resulted bit string is outputted.

Within the exemplary embodiment of the encoder depicted in FIG. 1, step 30 takes the first size L as input size and transforms it into an initiated bit string of Zero valued bits.

The initiated bit string generated by step 30 is extended in step 40. Step 40 transforms an input integer I by help of an input counter C into a binary code representing the input integer. Said binary code is appended to the initiated bit string. The length of the appended binary bit string corresponds to the input counter. Step 40 outputs an extended bit string.

As depicted in FIG. 1, step 40 is performed twice. After forming the initiated output bit string in step 30, step 40 is performed a first time, taking the first size L as the input integer I and transforming it into a binary code representation of the first size L which is appended to the initiated output bit string resulting in an intermediate bit string. This is done by using the second counter variable C' as the input counter. Then, step 40 is performed a second time, taking the reduced integer signal value V as the input integer I and transforming it into a binary code representation of the reduced integer signal value V which is appended to the intermediate output bit string. This is done by using the first counter variable C as the input counter.

Step 40 is depicted in FIG. 5 in more detail. It comprises step 400, which checks whether the input integer I is greater than Zero. If so, the input counter C is decremented by 1 in step 410. Then in step 420, a reductor R is calculated by help of the current input counter C according to:

$$R=2^C \quad (3)$$

In step 430 it is checked, whether the reductor R is larger than the input integer I. If not, the method diminishes the the input integer I by the reductor R in step 440. In step 450 the output bit string is extended by appending a bit of value 1. Then, the method returns to step 400.

If the reductor R is larger than the input integer I, steps 440 and 450 are bypassed and the output bit string is extended by appending a bit of value 0 in step 460. Then, the method returns to step 400.

If in step 400 it is determined, that the input integer I is not greater than Zero, within step 40 step 30 is performed. That is, the remaining input counter C is transformed into the respective number of zero valued bits.

In step 60 the bitstring representing a variable length encoding of the integer signal value V is outputted.

In another exemplary embodiment, execution of step 30 and the first execution of step 40 are performed, only, if the integer signal value exceeds a certain threshold. If not, the prefix is determined by help of a look-up table.

This is an exemplary look-up table for prefixes:

| 0   | 1   | 10     |
|-----|-----|--------|
| 2   | 3   | 11     |
| 4   | 7   | 0100   |
| 8   | 15  | 0101   |
| 16  | 31  | 0110   |
| 32  | 63  | 0111   |
| 64  | 127 | 001000 |
| 128 | 255 | 001001 |
| 256 | 512 | 001010 |

-continued

| | | |
|---|---|---|
| 512 | 1023 | 001011 |
| 1024 | 2047 | 001100 |
| 2048 | 4095 | 001101 |
| 4096 | 8191 | 001110 |
| 8192 | 16383 | 001111 |

Within the look-up table example, the first column contains lower bounds for value ranges. The middle column contains the respective upper bounds. The right column contains the respective prefix. In another exemplary embodiment of the table, the table comprises the upper bound column and the prefix column, only. The lower bounds then can be deduced from the upper bounds.

Sometimes, the integer signal value V is provided binary coded in a fixed length code. Then, in step 10 the fixed length is read bit by bit until a most significant bit, i.e. a bit of value 1 is read. From the number of bits read and the length of the fixed length code the first size L can be determined. As well, a remainder bit string can be formed. The remainder can be kept and appended to the bit string after first execution of step 40. Then second execution of step 40 then can be bypassed.

A code resulting from this exemplary variable length coding method depicted in FIG. 1 can be decoded, for instance, by the exemplary decoding method for variable length code depicted in FIG. 6. This exemplary decoding method employs an exemplary embodiment of the inventive method for determining a size. It regains a variable length encoded value.

The method commences with initialization of a counter C to Zero in step 600 and continues with the step 610 of reading a next bit. Prior to, simultaneously with or after reading the bit the counter C is incremented by one in step 620. In decision step 630 it is checked whether the bit is a Zero bit. If so, the method returns to step 610. Otherwise, the method passes to step 635.

In step 635 a preliminary size S is initialized to 1.

In step 640, the next bit R is read. In step 660 an add-on value A is calculated by help of the current preliminary size S according to:

$$A = S + R \tag{4}$$

Then, in step 670 the preliminary size S is increased by the add-on value A.

Prior to, simultaneously with or after incrementing the preliminary S, the counter value C is decremented by one in step 680.

Step 690 checks, whether the counter value C is greater than Zero. If so, the method returns to step 640.

Otherwise, the method passes to step 700.

In decision step 700 it is checked whether the preliminary size S is greater than 2. If so, the final size L is determined by diminishing the preliminary size S by 2 in step 710. Otherwise, the final size L is determined to be 1 and step 720 is performed. In step 720 an output value V is formed by transforming the next bit from binary to decimal.

If the preliminary size S is greater than 2, after step 710 steps 730-790 are performed.

In step 730 the output value V is initialized to 1.

In step 740, the next bit R is read. In step 760 the add-on value A is recalculated by help of the current output value V according to:

$$A = V + R \tag{5}$$

Then, in step 770 the output value V is increased by the add-on value A.

Prior to, simultaneously with or after incrementing the output value V, the preliminary size S is decremented by one in step 780.

Step 790 checks, whether the preliminary size S is greater than Zero. If so, the method returns to step 740.

Otherwise, the method passes to step 800. In step 800, the output value V is outputted.

An exemplary embodiment of the inventive encoder is depicted in FIG. 7.

The exemplary encoder receives a size to-be-coded at its input INP. The encoder also comprises a controller CON and declining means DEC. The declining means DEC subtracts each value received from a decliner value. The decliner value can be initialized and accessed by the controller CON. The controller CON may initialize the value of declining means DEC with the received pay load integer. The controller CON has also full access to a counter CNT. That is, the controller CON can initialize, read, decrease or increase the value of counter CNT. Furthermore, the controller CON may initialize an output bit string kept in an output bit string buffer OBS as empty bit string of length zero. And, the controller may append bits to the output bit string in the output bit string buffer OBS, one bit at a time. The controller can also access the output bit string buffer OBS and pass the output bit string to the encoder output OUT. That is, the output bit string might be, for instance, prepended to a data section carrying an integer signal value. As well, in a file system not restricting the length of filenames the output bit string may indicate the number of bits or bytes actually used for a certain file name.

The controller CON is in one of three states. That is, the controller CON is either in the state USZ of decoding a unary size, in the state BSZ of decoding a binary size or in the state VAL of decoding a variable length encoded value. Switching between states appears in dependence on the value of the counter CNT or on the value of last information unit read.

At the very beginning after reception of a size to-be-encoded, the controller is in state USZ. In state USZ, the encoder increases the size by 1. Then, the controller determines by help of the increased size a first length. The length corresponds to the length of a data section required for encoding the size. The value of counter CNT is initialized to the value of said length diminished by 2. An output bit string is initialized as an empty bit string of length Zero. The declining means DEC is initialized by the controller CON to the value of the increased size.

While being in state USZ, the controller CON appends a bit of value Zero to the output bit string and decreases the value of counter CNT by 1 as long as the value of counter CNT is larger than 1. As the value of counter CNT becomes 1, the controller switches to state BSZ.

After entering state BSZ, the value of counter CNT is initialized to the length of a data section required for encoding the size, again. The controller CON then decreases the value of counter CNT by 1. The controller CON calculates a subtraction value by help of the current value of counter CNT. Then, it is checked, whether the current value of the declining means DEC is smaller than the subtraction value. If the current value of the declining means DEC is not smaller than the subtraction value, the encoder passes the subtraction value to the declining means DEC. And, the controller CNT appends a bit of value 1 to the output bit string in the output bit string buffer OBS.

If the current value of the declining means DEC is smaller than the subtraction value, the controller CNT appends a bit of value 0 to the output bit string in the output bit string buffer OBS.

Then, the controller CNT checks whether the value of the counter CNT is larger than Zero. If so, the controller CON returns to decrementing the value of counter CNT. Otherwise, the controller CON excesses output bit string buffer OBS and outputs the output bit string to the encoder output OUT. Then, it switches back to state USZ.

An exemplary embodiment of the inventive method for decoding a size could be performed by an exemplary decoder depicted in FIG. 8.

The exemplary decoder is adapted to access a stream of information units STR by help of a reading device RED. The stream STR may be received from a transmitting device or as broadcasted stream. In another exemplary embodiment the reading device RED is suitable for accessing information units on a storage medium. The reading device RED reads values of single information units, one at a time, and passed the value read to a controller CON. The controller CON may pass the received value or any other value to accumulating means ACC. The accumulating means ACC add each value received to an accumulator value. The accumulator value can be initialized and accessed by the controller CON. The controller CON has also full access to the value of a counter CNT. That is, the controller CON can initialize, read, decrease or increase the counter CNT.

The controller CON is in one of three states. That is, the controller CON is either in the state USZ of decoding a unary size, in the state BSZ of decoding a binary size or in the state VAL of decoding a variable length encoded value. Switching between states appears in dependence on the value of the counter CNT or on the value of last information unit read.

At the very beginning, the controller is in state USZ and initializes the counter CNT to Zero. For each value of an information unit the controller CON receives from the reading device during state USZ, the controller increments the counter CNT by 1. While being in state UBZ, the controller checks each information unit value received whether it is Zero. If not, the controller CON switches to state BSZ.

After entering state BSZ, the controller CON sets the accumulator value to 1.

While being in state BSZ, the controller CON passes a value to-be-added to the accumulating means ACC. The value to-be-added is formed by summing the the current value of the accumulating means ACC and the value of the currently passed information unit. For each value of an information unit the controller CON receives from the reading device during state BSZ, the controller decrements—after reception—the counter CNT by 1.

If the counter CNT reaches or drops below 0, the controller CON switches to state VAL.

When entering state VAL, the controller CON first checks whether the actual value of the accumulating means ACC does not exceed 2. If so, the next value passed from the reading means to the controller CON, will be passed by the controller to an output device OUT and the controller will switch back to state USZ.

Otherwise, the controller CON sets the value of the counter to the accumulator value decreased by 2. Then, the controller CON initializes the accumulating means ACC by setting the accumulator value to 1.

While being in state VAL, the controller CON passes a value to-be-added to the accumulating means ACC. The value to-be-added is formed by summing the current value of the accumulating means ACC and the value of the currently passed information unit. For each value of an information unit the controller CON receives from the reading device during state BSZ, the controller decrements—after reception—the counter CNT by 1.

If the counter CNT reaches or drops below 0, the controller CON passes the actual accumulator value to the output device OUT. Then, the controller switches back to state USZ.

The invention claimed is:

1. Method for encoding a size of a data section, the method comprising the steps of
   Increasing the size;
   Determining a number of information units necessary for encoding the increased size;
   Decreasing the determined number;
   Forming a code by encoding the decreased determined number and by encoding the increased size.

2. Method according to claim 1, characterized by
   Increasing the size by one and
   Decreasing the determined number by two.

3. Method according to claim 1, wherein
   the increased size is binary encoded;
   the decreased determined number is encoded by a respective number of information units of equal content and
   the code is formed by concatenating the two encodings.

4. Method for determining a size from a string of information units, the method comprising
   reading one or more information units until a information unit with a pre-defined value is read wherein for each information unit read a counter is incremented;
   Reading the counted number of subsequent information units;
   Decoding a value comprised in the subsequent information units read
   Determining a preliminary size by adding a counter dependent value to the decoded value and
   Determining the size by decreasing the preliminary size.

5. Method according to claim 4, characterized by
   Decreasing the preliminary size by two, if the preliminary size is greater than two.

6. Method according to claim 4, wherein the size indicates the size of a data section comprised in the information unit string.

7. Decoder for determining a size from a string of information units, the decoder comprises
   Means for reading information units;
   A counter;
   a controller for controlling reading of information units in dependency on the counter;
   Means for decoding a value comprised in the sequence of information units read and
   Means for determining the size by decreasing the decoded value.

8. Encoder for encoding a size, the encoder comprising
   means for increasing the size;
   means for encoding the increased size wherein the number of information units necessary for encoding can be determined;
   means for decreasing the determined number of information units;
   means for encoding the decreased number of information units.

9. A storage medium comprising a size indicator wherein the size indicator is encoded in accordance to a method which comprises the features of any of the claim 1.

* * * * *